United States Patent
Schapendonk

(10) Patent No.: US 9,897,635 B2
(45) Date of Patent: Feb. 20, 2018

(54) SENSOR CIRCUIT

(71) Applicant: NXP B.V., Eindhoven (NL)

(72) Inventor: Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 45 days.

(21) Appl. No.: 15/244,368

(22) Filed: Aug. 23, 2016

(65) Prior Publication Data
US 2017/0131333 A1    May 11, 2017

(30) Foreign Application Priority Data

Sep. 1, 2015    (EP) .................................... 15183285

(51) Int. Cl.
    G01R 27/08    (2006.01)
    H03M 1/12    (2006.01)
    (Continued)

(52) U.S. Cl.
    CPC .......... G01R 27/02 (2013.01); G01R 17/105 (2013.01); H03M 3/00 (2013.01); H03M 3/04 (2013.01); H03M 3/458 (2013.01)

(58) Field of Classification Search
    CPC ..... G01R 27/02; G01R 17/105; H03M 3/458; H03M 3/00; H03M 3/04; H03M 1/12
    (Continued)

(56) References Cited

U.S. PATENT DOCUMENTS 5,469,071 A * 11/1995 Obata .................... G01K 7/206
                                                                324/691
8,044,702 B2    10/2011 Niederberger
(Continued)

FOREIGN PATENT DOCUMENTS

EP    2 955 492 A1    12/2015

OTHER PUBLICATIONS

Bryant, James et al: "Data Converter Architectures"; Data Conversion Handbook; Retrieved from the Internet: http://www.analog.com/library/analogDialogue/archives/39-06/Chapter 3 Data Converter Architectures F.pdf on Apr. 10, 2013; pp. 3.46-3.87; (Mar. 1, 2004).

(Continued)

Primary Examiner — Amy He
(74) Attorney, Agent, or Firm — Charlene R. Jacobsen

(57) ABSTRACT

A sensor circuit incorporates an analog to digital converter for providing a digital signal derived from sensing elements connected in a bridge configuration. The sensor circuit comprises first and second paths comprising respective first and second sensing elements connected between first and second supply lines; an analog to digital converter having a differential input connected to receive a differential voltage signal (Vinp–Vinn) between the first and second sensing elements and an output for providing a digital output signal (Dout) representing a difference between the first and second sensing elements, the analog to digital converter comprising: current sources connected between the first and second supply lines, each current source being switchably connected to either the first or second sensing elements; and control logic configured to selectively switch current from each of the current sources to either the first path or the second path in dependence on the differential voltage signal.

13 Claims, 3 Drawing Sheets

(51) Int. Cl.
    *G01R 27/02* (2006.01)
    *H03M 3/00* (2006.01)
    *H03M 3/04* (2006.01)
    *G01R 17/10* (2006.01)

(58) Field of Classification Search
    USPC .................................. 324/706, 691; 341/155
    See application file for complete search history.

(56) References Cited

U.S. PATENT DOCUMENTS

2005/0206543 A1* 9/2005 Draxelmayr .......... H03M 3/372
                                                        341/143
2008/0246645 A1* 10/2008 Scholtens ............. H03M 1/365
                                                        341/155

OTHER PUBLICATIONS

Extended European Search Report for Patent Appln. No. 15183285.4 (dated Mar. 18, 2016).

* cited by examiner

SENSOR CIRCUIT

CROSS-REFERENCE TO RELATED APPLICATIONS

This application claims the priority under 35 U.S.C. § 119 of European patent application no. 15183285.4, filed Sep. 1, 2015 the contents of which are incorporated by reference herein.

FIELD

The disclosure relates to sensor systems, in particular to such systems incorporating analogue to digital converters, for example for use in providing a digital signal derived from sensing elements connected in a bridge configuration.

BACKGROUND

In many sensor applications, such as for magnetic field, temperature or mechanical strain sensing, resistive sensing elements are used, which are influenced by the physical quantity to be measured. To produce a reliable and a sensitive output signal, the sensing elements may be connected in a bridge configuration such as a Wheatstone bridge. This provides a balanced differential output voltage between two nodes of the bridge, the differential output voltage being proportional to a change in the physical quantity being measured and to a supply voltage across the bridge. This analogue differential signal may be digitised by connecting the output voltage to the inputs of a differential Analogue to Digital Converter (ADC).

The performance of the ADC is to a large extent determined by the accuracy of two reference voltage levels, each of which may be provided by a reference voltage source. The two reference voltage levels may be provided indirectly from the supply voltage by means of an appropriate circuitry, for example using voltage dividers. A drawback of this is that it may be difficult to generate low noise and accurate reference voltage levels. Further, a significant fraction of the power consumed will tend to be used for the generation of the reference voltage levels. With high frequency noise present at the supply voltage the frequency bandwidth of the reference voltage levels will be different than the frequency bandwidth of the bridge signals. This means that high frequency noise present on the supply voltage will not be suppressed due to a phase and/or amplitude difference between signal and reference, but instead converted into the digital domain. This could even result in an unwanted aliasing. High frequency noise can further fold back into the Band of Interest (BOI) of the ADC. In particular in case of comparatively intense noise being present on the supply voltage, a large full signal swing of the differential output voltage must be processed by the ADC, resulting in high linearity requirements of the ADC.

As a consequence of the drawbacks mentioned above, the performance of existing sensor systems comprising sensing elements arranged in a full bridge configuration and an ADC for providing a digital output may be reduced.

SUMMARY

In accordance with the present disclosure there is provided a sensor circuit comprising:
first and second sensor paths comprising respective first and second sensing elements connected between first and second supply lines; and an analogue to digital converter having a differential input connected to receive a differential voltage signal between the first and second sensing elements and an output for providing a digital output signal representing a difference between the first and second sensing elements, the analogue to digital converter comprising:
control logic configured to selectively switch current from each of the current sources to either the first path or the second path in dependence on the differential voltage signal; and
a plurality of current sources connected between the first and second supply lines, each current source being switchably connected to either the first or second sensing elements.

The sensing elements of the sensor system are in effect isolated from the supply line (where the first supply line is a voltage supply line and the second supply line is ground), thereby improving the power supply rejection ratio (PSRR) of the sensor system.

The sensor circuit requires only two sensing elements, which saves area on an integrated circuit implementation and enables sensor elements to be placed in close proximity so that any variations in the parameter to be measured between the different sensor elements are minimised.

The analogue to digital converter may take various forms. As a first example, the analogue to digital converter may comprise:
a transconductance amplifier having first and second inputs connected respectively to the first and second sensing elements for receiving the differential voltage signal between the first and second paths;
a comparator having an input connected to an output of the transconductance amplifier and an output for providing the digital output signal; and
control logic configured to control switching of the plurality of current sources between the first and second paths in dependence on the digital output signal.

The comparator may be a multi-bit comparator or may be a single bit comparator.

As an alternative second example, the analogue to digital converter may comprise:
a comparator having first and second inputs connected respectively to the first and second sensing elements for receiving the differential voltage signal between the first and second paths and configured to provide a digital output indicating a sign of the differential voltage signal; and
successive approximation control logic having an input connected to receive the digital output from the comparator and configured to provide the digital output signal and to control switching of the plurality of current sources between the first and second paths in dependence on the digital output signal.

In each example embodiment the control logic may be configured to switch current to the second sensor path from a selected number of the current sources that is equal to a value of the digital output signal. If, for example, the resolution of the digital output signal is 3 bits, a total of 8 (i.e. $2^3$) switchable current sources may be used, a number of which that is equal to the value of the output signal will provide current to the second sensor path, while the other current sources will provide current to the first sensor path. In a general aspect therefore, the number of switchable current sources will be equal to $2^N$, where N is the bit resolution of the analogue to digital converter.

The control logic may be configured to repeatedly change a subset of the plurality of current sources from which the number of current sources is selected. By repeatedly changing the subset of current sources, any variations between the currents provided by each of the current sources can be spread out over time in the form of high frequency noise, which can be filtered out. In particular embodiments the processing unit may be configured to repeatedly change the subset randomly. This process is generally known as Dynamic Element Matching (DEM).

The first and second sensing elements may be resistive sensing elements, which would typically be the case for many types of sensor such as for magnetic, temperature and strain sensing applications.

The first and second sensing elements may be configured to change their resistance equally and in opposition in response to a change in a measured parameter. The resulting digital output signal will then be in proportion to the change in measured parameter.

The first and second sensing elements may be magnetic sensing elements, for example magnetoresistive sensing elements, which can be used in speed and angular sensor applications.

The sensor system may also comprise a power supply source connected between the first and second supply terminals. In alternative embodiments the power supply source may be obtained externally to the sensor system.

In certain embodiments, each of the plurality of current sources may be connected to the first supply terminal and switchably connected to the first or second sensing elements along the respective first or second paths.

In certain alternative embodiments, each of the plurality of current sources may be connected to the second supply terminal and switchably connected to the first or second sensing elements along the respective first or second paths, the first and second paths each comprising a bias current source connected between the first supply terminal and the first and second sensor element respectively.

The sensor circuit may be incorporated into a sensor, for example for use in angular and speed sensors.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
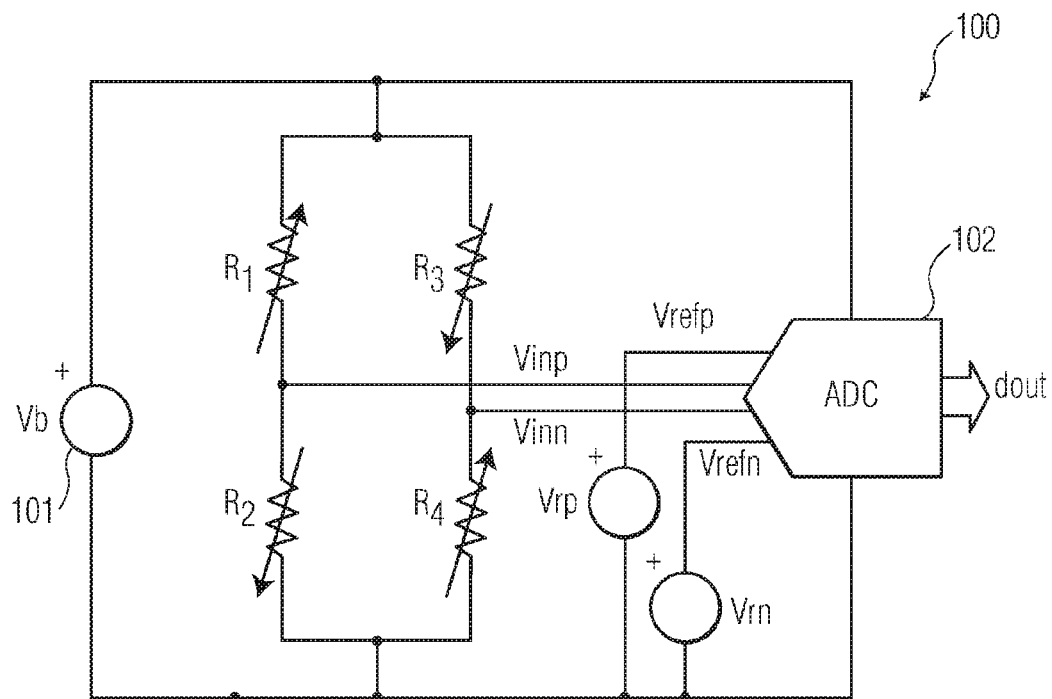
FIG. 1 illustrates a differential sensor with sensing elements connected in a full bridge configuration.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

In the example sensor circuit 100 illustrated in FIG. 1, the sensing elements $R_1$, $R_2$, $R_3$, $R_4$, represented as variable resistors, are connected in a full bridge configuration. This configuration provides a balanced differential output voltage Vinp−Vinn proportional to an applied bias voltage Vb provided by a voltage supply 101. In order to perform complex digital signal processing the bridge signals Vinp, Vinn are connected to the inputs of a differential high accuracy Analog-to-Digital-Converter (ADC) 102 which converts the analogue signals to the digital domain. The performance of the ADC 102 is to a large extent determined by the accuracy of the reference source of the ADC 102, provided by voltage sources Vrp and Vrn. These voltage sources should track the bias voltage Vb to minimise the effect of noise on the supply of the full bridge. In this way the input range of the ADC 102 scales with the bias voltage Vb as well as the input signals Vinp and Vinn of the ADC 102, resulting in a digital output signal dout that is independent of the bias voltage Vb.

The sensor circuit 100 shown in FIG. 1 has some drawbacks. Generating a low noise accurate reference voltage tracking the bias voltage is not trivial. A significant part of the power consumed by the ADC 102, as well as the area taken up by the ADC in an integrated circuit, will be used for reference signal generation. As mentioned above, the reference voltages Vrp and Vrn should track the bias voltage Vb to make the digital output signal dout independent of the bias voltage Vb. The voltage signals Vinp and Vinn will have a different bandwidth than reference signals Vrefp and Vrefn, so at high frequencies the tracking between reference sources and the bias source will be less accurate. This means that high frequency noise on the bridge supply will not be suppressed, but will be converted to the digital domain. This could even result in aliasing. High frequency noise can then fold back in to the Band Of Interest (BOI).

Figure 2:
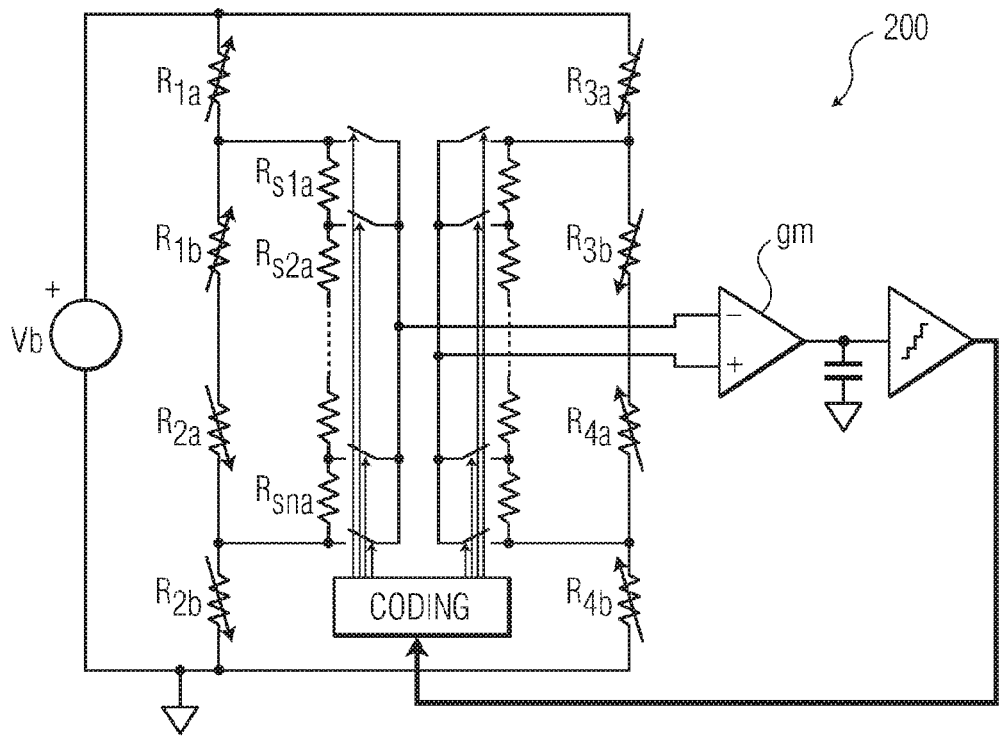
FIG. 2 illustrates a differential sensor in which an analogue to digital converter is integrated in the full bridge configuration.

The ADC 102 also needs a large common mode range to cope with common mode differences between the input signal Vinp−Vinn and the reference signal Vrefp−Vrefn. An alternative that aims to address these issues is illustrated in the sensor circuit 200 of FIG. 2. In this circuit 200, the reference for the ADC is integrated in the full bridge configuration, resulting in a fully symmetrical sensing system without the need for a separate bias circuit for the ADC. This circuit is described in more detail in European patent application 14172427.8, filed on 13 Jun. 2014. This circuit still has some disadvantages. The Power Supply Rejection Ratio (PSRR) of this configuration is still less than ideal due to mismatch between the resistors. Furthermore, it is difficult to achieve a high linearity due to the different bias conditions of the DAC elements $R_{s1a}$ to $R_{sna}$. All resistors and switches operate at a different voltage. DEM algorithms, which can be used to randomize such systematic errors, cannot easily be applied with elements that are connected in series because the additional connections and switches required to enable this would make the circuit much more complex and impractical.

Figure 3:
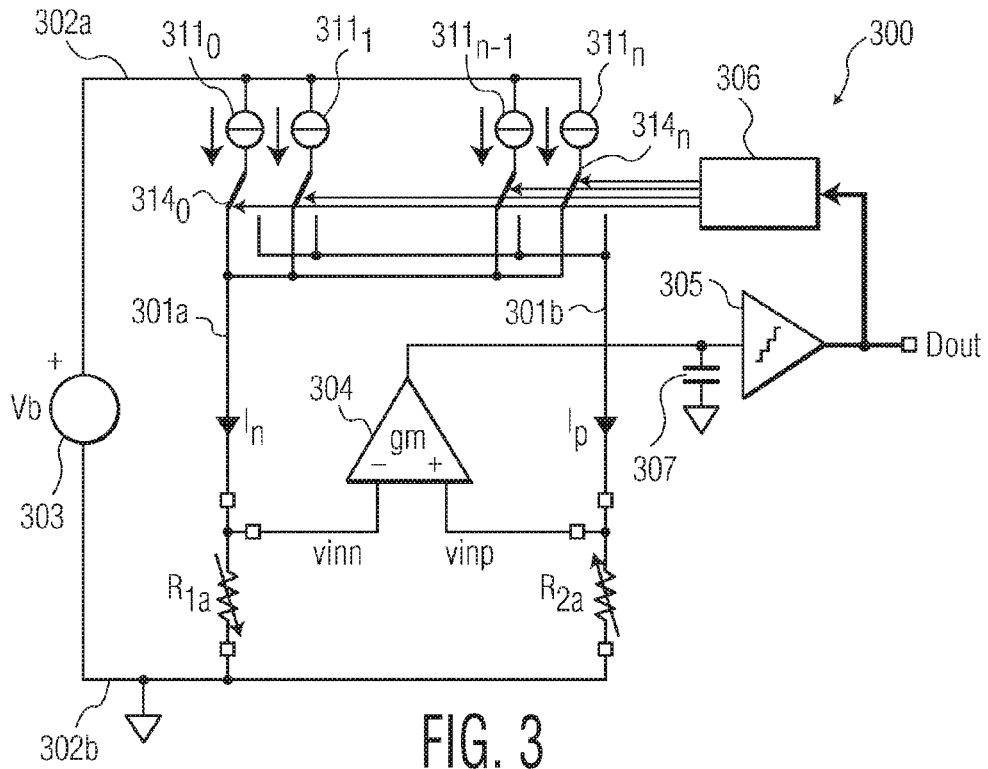
FIG. 3 illustrates a differential sensor having two sensing elements and a sigma-delta analogue to digital converter.

A solution to the above mentioned issues is to switch from a full-bridge configuration with a voltage DAC to a configuration requiring only two sensing elements and using a current DAC. An example of this is illustrated in the sensor circuit 300 of FIG. 3. The sensor circuit 300 comprises first and second paths 301a, 301b, the first path 301a having a first sensing element $R_{1a}$ and the second path 301b having a second sensing element $R_{2a}$, which in the embodiment shown are in the form of variable resistors. The sensing elements $R_{1a}$, $R_{2a}$ are connected between first and second supply lines 302a, 302b, which are connected to a bias voltage source 303, providing a bias voltage Vb. In this example embodiment, the sensing elements $R_{1a}$, $R_{2a}$ are connected directly to the second supply line 302b and to the first supply line 302a via a plurality of current sources $311_0$, $311_1 \ldots 311_{n-1}$, $311_n$.

Each of the plurality of current sources $311_0$, $311_1 \ldots 311_{n-1}$, $311_n$ is switchably connected, by means of respective switches $314_{0-n}$, to either the first or second sensing elements $R_{1a}$, $R_{2a}$. Current from each of the current sources $311_{0-n}$ can thereby be selected to pass along the first path 301a or the second path 301b by means of the selected position of each of the switches $314_{0-n}$. The position of each of the switches $314_{0-n}$ is determined by control logic 306, the operation of which is described in more detail below.

A differential voltage signal Vinn–Vinp from the two sensing elements $R_{1a}$, $R_{2a}$ is provided to an ADC for converting the voltage signal to a digital output Dout. In the example circuit 300 in FIG. 3 the ADC is a sigma-delta converter, which comprises a transconductance amplifier or gm stage 304, a capacitor 307, a multi-bit comparator 305, control logic 306 and a feedback DAC consisting of the current sources $311_0$, $311_1 \ldots 311_{n-1}$, $311_n$ and switches $314_{0-n}$. The gm stage 304 receives the differential voltage signal Vinn–Vinp from the two sensing elements $R_{1a}$, $R_{2a}$ and provides a single ended output signal to an input of the comparator 305. The example embodiments described herein are shown with single ended output stages. Alternative example embodiments may be fully differential, enabling higher resolution. The capacitor 307 is connected between the input of the comparator 305 and ground for low-pass filtering of the signal. An output of the comparator 305 provides the digital output signal Dout, which represents a difference between the first and second sensing elements. In the illustrated example, only two sensing elements are required, both being connected to ground (i.e. the second supply line 302b). The resistors $R_{1a}$, $R_{2a}$ are isolated from the supply line 302a by the current sources $311_{0-n}$. This improves the PSRR of the circuit 300.

The switches 314a-n are controlled by the control logic 306 in dependence on the digital signal output Dout, such that the number of current sources connected to the second path 301b is equal to a value of the digital output signal Dout.

The linearity of the current DAC can be improved by several different DEM techniques. This can be implemented by randomizing the control signals to the DAC elements, each DAC element being a current source and an associated switch. Applying DEM minimizes the required area for the DAC elements while increasing the linearity.

Where the sensor elements $R_{1a}$, $R_{2a}$ are resistors that respond equally and oppositely to a change in a sensed quantity, the response to a change in sensed quantity can be determined as follows.

The voltage on node Vinp is given by:

$$Vinp = I_p \cdot R_{2a} = I_p \cdot (R + \Delta R)$$

where $I_p$ is the current flowing through the second path 301b, R is the nominal value of each resistor $R_{1a}$, $R_{2a}$ and $\Delta R$ is the change in resistance due to a change in a sensed quantity.

The voltage on node Vinn is given by:

$$Vinn = I_n \cdot R_{2a} = I_p \cdot (R + \Delta R)$$

where $I_n$ is the current flowing through the first path 301a. The current $I_p$ is given by:

$$I_p = (x+1) \cdot I_{ref}$$

where x+1 is the number of current sources switched to be connected to the second path 301b.

The current $I_n$ is given by:

$$I_n = (1-x) \cdot I_{ref}$$

The digital output Ddout is given by:

$$Dout = x \cdot 2^n$$

where the total number of current sources is n+1.

Due to the loop gain Vinp can be considered equal to Vinn.

$$I_p \cdot (R + \Delta R) = I_n \cdot (R - \Delta R),$$

$$(x+1) \cdot I_{ref} \cdot (R + \Delta R) = (1-x) \cdot I_{ref} \cdot (R - \Delta R)$$

$$x \cdot R + x \cdot \Delta R + R + \Delta R = R - \Delta R - x \cdot R + x \cdot \Delta R$$

$$2 \cdot x \cdot R = -2 \cdot \Delta R$$

$$x = \Delta R / R$$

$$Dout = \Delta R / R \cdot 2^n$$

This shows that there is a linear relation between the change in resistance $\Delta R$ and the digital output signal Dout.

A further advantage of the sensing circuit 300 is that all DAC elements operate under the same bias conditions. This improves the integral nonlinearity of the DAC.

Figure 4:
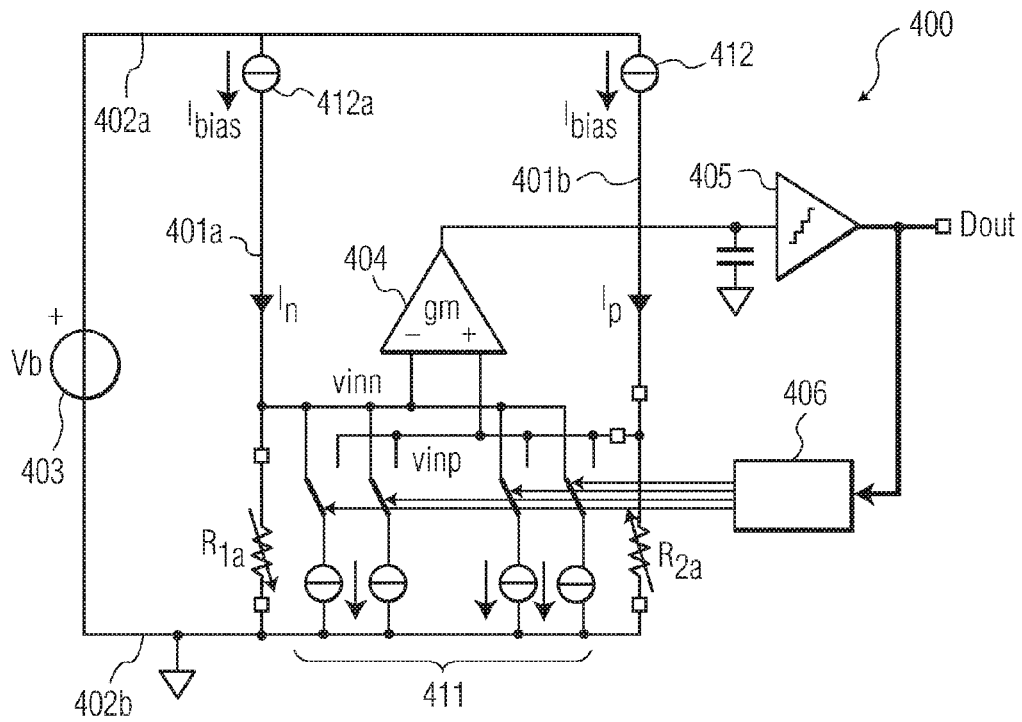
FIG. 4 illustrates an alternative example of a differential sensor having two sensing elements and a sigma-delta converter.

FIG. 4 illustrates an alternative example of a sensor circuit 400, in which the DAC and sensor elements are used in a sigma-delta ADC configuration. As with the sensor circuit 300 of FIG. 3, the sensor circuit 400 comprises first and second paths 401a, 401b having first and second sensing elements $R_{1a}$, $R_{2a}$ connected between first and second supply lines 402a, 402b. A plurality of current sources 411 are connected between the first and second supply lines 402a, 402b, each current source being switchably connected to either the first or second sensing elements $R_{1a}$, $R_{2a}$. Bias current sources 412a, 412b are connected in the first and second paths 401a, 401b respectively, between the first supply line 402a and the first and second sensing elements $R_{1a}$, $R_{2a}$ respectively. Instead of the switchable current sources being connected to the first supply line 402a, as in the sensor circuit 300 of FIG. 3, the current sources 411 in the alternative circuit 400 are connected to the second supply line, or ground, 402b. Operation of the circuit 400 is similar to that described above in relation to FIG. 3, in that a differential voltage signal is applied to the gm stage 404, which provides a signal to a comparator 405. The comparator 405 provides a digital output signal Dout, which is fed back to control logic 406 to control switching of the current sources 411.

Figure 5:
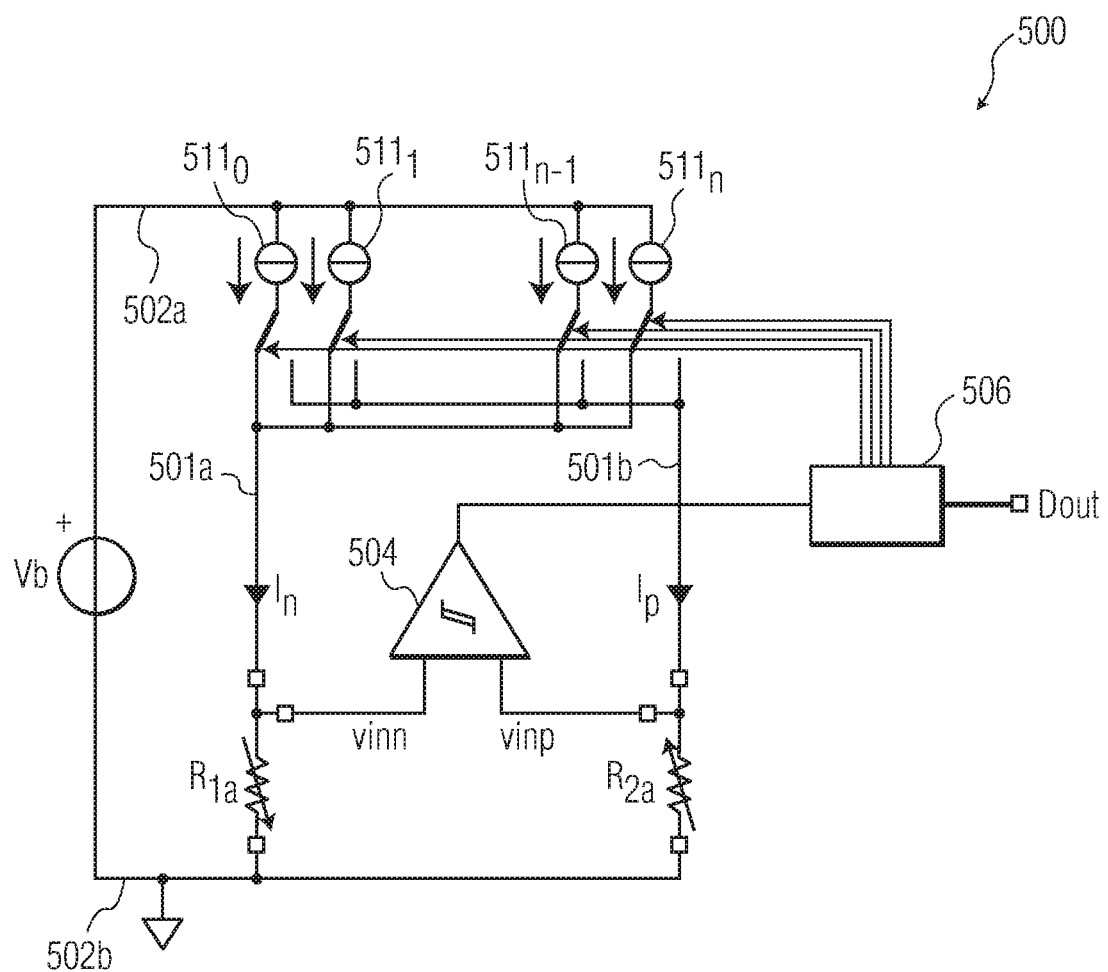
FIG. 5 illustrates an alternative differential sensor to that of FIGS. 3 and 4, using a successive approximation register analogue to digital converter.

The DAC and sensing elements can also be used in other ADC concepts that use a DAC in a feedback loop, an example of which is a successive approximation ADC. A sensor circuit 500 incorporating a successive approximation ADC is illustrated in FIG. 5. As with the other examples in FIGS. 3 and 4, the sensor circuit 500 comprises first and second paths 501a, 501b comprising respective first and second sensing elements R1a, R2a connected between first and second supply lines 502a, 502b. A plurality of current sources $511_0 \ldots 511_n$, are connected between the first and second supply lines 502a, 502b, each current source being switchably connected to either the first or second sensing elements R1a, R2a. A comparator 504 receives a differential voltage signal between the first and second sensing elements R1a, R2a and provides a digital output indicating a sign of the differential voltage signal to control logic 506. The control logic 506 provides a digital output signal Dout and controls switching of the current sources to maintain a balance between the currents $I_n$, $I_p$ flowing through the first and second paths 501a, 501b.

From reading the present disclosure, other variations and modifications will be apparent to the skilled person. Such variations and modifications may involve equivalent and other features which are already known in the art of differential sensing applications and analogue to digital converters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A sensor circuit comprising:
   first and second paths comprising respective first and second sensing elements connected between first and second supply lines; and;
   an analogue to digital converter having a differential input connected to receive a differential voltage signal between the first and second sensing elements and an output for providing a digital output signal representing a difference between the first and second sensing elements, the analogue to digital converter comprising:
   a plurality of current sources connected between the first and second supply lines, each current source being switchably connected to either the first or second sensing elements; and
   control logic configured to selectively switch current from each of the current sources to either the first path or the second path in dependence on the differential voltage signal.

2. The sensor circuit of claim 1 wherein the analogue to digital converter comprises:
   a transconductance amplifier having first and second inputs connected respectively to the first and second sensing elements for receiving the differential voltage signal between the first and second paths;
   a comparator having an input connected to an output of the transconductance amplifier and an output for providing the digital output signal; and
   control logic configured to control switching of the plurality of current sources between the first and second paths in dependence on the digital output signal.

3. The sensor circuit of claim 1 wherein the analogue to digital converter comprises:
   a comparator having first and second inputs connected respectively to the first and second sensing elements for receiving the differential voltage signal between the first and second paths and configured to provide a digital output indicating a sign of the differential voltage signal; and
   successive approximation control logic having an input connected to receive the digital output from the comparator and configured to provide the digital output signal and to control switching of the plurality of current sources between the first and second paths in dependence on the digital output signal.

4. The sensor circuit of claim 1 wherein the control logic is configured to switch current to the second sensor path from a selected number of the current sources that is equal to a value of the digital output signal.

5. The sensor circuit of claim 4 wherein the control logic is configured to repeatedly change a subset of the plurality of current sources from which the number of current sources is selected.

6. The sensor circuit of claim 5 wherein the control logic is configured to repeatedly change the subset randomly.

7. The sensor circuit of claim 1 wherein the first and second sensing elements are resistive sensing elements.

8. The sensor circuit of claim 7 wherein the first and second sensing elements are configured to change their resistance equally and in opposition in response to a change in a measured parameter.

9. The sensor circuit of claim 7 wherein the first and second sensing elements are magnetic sensing elements.

10. The sensor circuit of claim 1 wherein each of the plurality of current sources is connected to the first supply terminal and switchably connected to the first or second sensing elements along the respective first or second paths.

11. The sensor circuit of claim 1 wherein each of the plurality of current sources is connected to the second supply terminal and switchably connected to the first or second sensing elements along the respective first or second paths, the first and second paths each comprising a bias current source connected between the first supply terminal and the first and second sensor element respectively.

12. The sensor circuit of claim 1 comprising a power supply source connected between the first and second supply terminals.

13. A sensor comprising a sensor circuit according to claim 12.

* * * * *